United States Patent
Sievers

(10) Patent No.: US 8,820,234 B2
(45) Date of Patent: Sep. 2, 2014

(54) CURING OF PHOTO-CURABLE PRINTING PLATES WITH FLAT TOPS OR ROUND TOPS BY VARIABLE SPEED EXPOSURE

(75) Inventor: Wolfgang Sievers, Kremperheide (DE)

(73) Assignee: Esko-Graphics Imaging GmbH, Itzehoe (DE)

( * ) Notice: Subject to any disclaimer, the term of this patent is extended or adjusted under 35 U.S.C. 154(b) by 892 days.

(21) Appl. No.: 12/909,626

(22) Filed: Oct. 21, 2010

(65) Prior Publication Data
US 2011/0104615 A1 May 5, 2011

Related U.S. Application Data

(60) Provisional application No. 61/256,892, filed on Oct. 30, 2009.

(51) Int. Cl.
*G03F 7/20* (2006.01)

(52) U.S. Cl.
USPC .................................. 101/401.1; 101/395

(58) Field of Classification Search
CPC .... G03F 7/2022; G03F 7/2014; G03F 7/2012
USPC .................. 101/401.1, 395, 467, 463.1, 487; 430/269, 306, 945; 347/248, 225
See application file for complete search history.

(56) References Cited

U.S. PATENT DOCUMENTS

| 6,266,134 | B1 | 7/2001 | Gelbart | |
|---|---|---|---|---|
| 2001/0052924 | A1 | 12/2001 | Steinke et al. | |
| 2008/0157009 | A1* | 7/2008 | Wittenberg et al. | 250/494.1 |
| 2009/0290891 | A1 | 11/2009 | Sievers | 399/51 |
| 2009/0294696 | A1 | 12/2009 | Sievers | 250/492.1 |

FOREIGN PATENT DOCUMENTS

| EP | 0785474 | 7/1997 |
|---|---|---|
| EP | 0913730 | 5/1999 |
| WO | WO 2005/076082 | 8/2005 |
| WO | WO 2008/135865 | 11/2008 |

OTHER PUBLICATIONS

Extended Search Report mailed Jul. 6, 2011 for counterpart European application No. 10189452.5.

* cited by examiner

*Primary Examiner* — Judy Nguyen
*Assistant Examiner* — Jennifer Simmons
(74) *Attorney, Agent, or Firm* — Dov Rosenfeld; Inventek

(57) ABSTRACT

An apparatus for curing a printing plate made of or having photo-curable material, a method of curing such a printing plate, and a printing plate cured by the method. One embodiment of the method includes curing a printing plate made of or having photo-curable material thereon. The method includes producing light energy on part of the printing plate using a light exposure unit, including relative motion between the light energy and the plate in a transverse direction at a changeable period of repetition, such that curing can produce printing features on the plate that can be switched to have either flat tops or round tops according to the period of repetition.

22 Claims, 12 Drawing Sheets

CURING OF PHOTO-CURABLE PRINTING PLATES WITH FLAT TOPS OR ROUND TOPS BY VARIABLE SPEED EXPOSURE

RELATED APPLICATION

The present invention claims benefit of and is a conversion of U.S. Provisional Patent Application No. 61/256,892 titled "CURING OF PHOTO-CURABLE PRINTING PLATES WITH FLAT TOPS OR ROUND TOPS BY VARIABLE SPEED EXPOSURE, filed 30 Oct. 2009 to inventor Sievers, the contents of which are incorporated herein by reference.

FIELD OF THE INVENTION

The present disclosure relates generally to preparing printing plates.

BACKGROUND

This disclosure describes a method and an apparatus for improving light exposure, e.g., ultraviolet exposure of photo-curable printing plates, e.g., photopolymer flexographic printing plates, letterpress plates and other polymer printing plates, as well as polymer sleeves and polymer coated printing cylinders. Photo-curable, of course, means curable by photons, e.g., light, e.g., light in the ultraviolet range or some other range.

Photopolymer plates have found a broad range of applications. A variety of different methods can be applied for transferring an image for printing, e.g., in the form of imaging data, to a polymer plate. For example, an image mask, which can be a film applied to the surface of the plate while the plate is exposed, or a layer directly on top of the polymer surface is laser ablated layer directly on top of the polymer surface, is placed on top of a polymer sheet.

By a digital plate is meant a plate that is exposed to imaging data by ablating a mask material that is on the plate, e.g., by exposure to laser radiation in an imaging device. The process of producing a digital plate is called a digital process herein.

By a conventional analog plate is meant a plate that is exposed to imaging data by exposing photographic film according to the imaging data, and then using the film to form a mask during exposure to curing radiation. The process of producing a conventional analog plate is called an analog process herein.

Irrespective of the way imaging data is transferred to the plate, the plate needs light, e.g., UV light for curing. Such UV curing is currently done by one of several different methods. After curing, the non-cured portions of the polymer are removed, either using solvents, or by melting the non cured material through heat treatment and absorption with a web.

Polymer printing plates are three dimensional, that is, include a depth dimension from the printing surface. Small printing details on the plate's surface carry ink for printing. Analog plates, i.e., plates produced using a conventional analog process can produce small features that have printing features that are substantially flat. Such a feature is called a flat top herein. It is much more difficult to produce such flat tops on digital plates, i.e., using a digital process. Features on digital plates tend to have rounded surfaces that extend down in depth. Such a feature is called a round top herein.

It would be advantageous to have a method and apparatus that allows the shape of the three dimensional printing features, such as halftone dots and other structures on the printing plate to be controlled, e.g., so that round tops or flat tops can be produced on a digital plate as an operator choice.

Commonly owned U.S. Application Publication No. US 2009-0294696 A1 published Dec. 3, 2009 and titled CURING OF PHOTO-CURABLE PRINTING PLATES WITH FLAT TOPS OR ROUND TOPS describes an apparatus and methods that take advantage of the observation made by the inventor that one way to control the shape of haltone dots is to have a method and apparatus that provides for illuminating an exposed photopolymer plate at two levels, a first high intensity followed by illumination by a lower intensity. Having UV sources, arrangements, and control systems described in US 2009-0294696 A1 may be expensive.

DESCRIPTION OF EXAMPLE EMBODIMENTS

Overview

Figure 1:
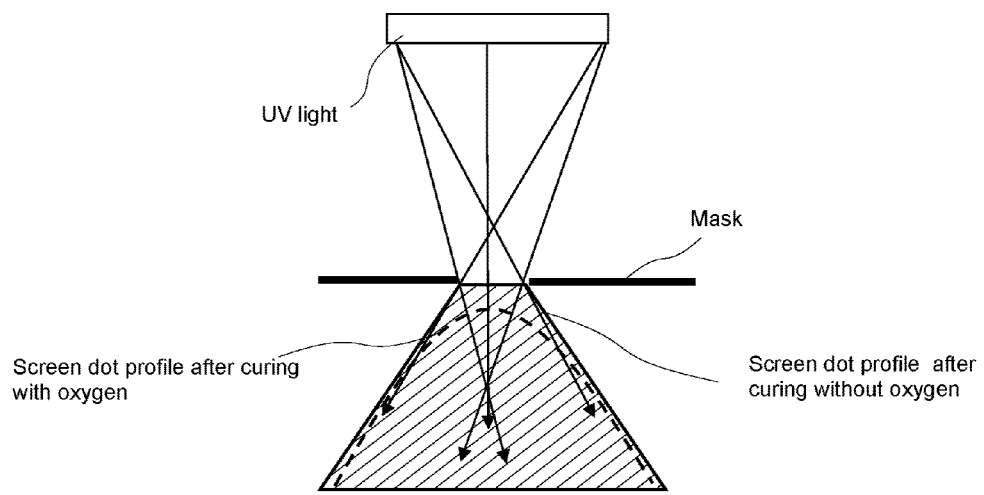
FIG. 1 shows a simple cross-section of an example halftone dot that results from UV exposure through a mask by UV light from a UV source.

Described herein is a method and apparatus, and a plate cured using the method. The method and apparatus allow the shape of the three dimensional printing features, such as halftone dots and other structures on the printing plate to be controlled.

This can be applied with digital flexography, digital letterpress printing, and other digital printing plates, as well as polymer sleeves and polymer coated printing cylinders.

One embodiment includes an apparatus for curing a printing plate made of or having photo-curable material e.g., UV-curable material thereon. The apparatus comprises a light exposure unit including a light source, e.g., a UV source to produce light energy, e.g., UV energy, the light exposure unit capable of generating at least one illumination intensity. The apparatus further comprises a drive mechanism to produce relative motion between the light exposure unit and the plate during curing of the plate, and a control system coupled to and configured to control the drive mechanism and light exposure unit. The apparatus is arranged such that there is motion in a transverse direction, and the light intensity is applied repeatedly to any region by scanning the moving the light source periodically in the transverse direction, with a period denoted T. At any time, the light source illuminates a relatively small proportion of the extent of the printing plate in the transverse direction.

The combination of the control system, drive system, and light source are arranged such that the period of repetition of illumination by the light source of any area on the plate due to the relative motion in the transverse direction is controllable to produce either flat top halftone dotes or round top halftone dots. More specifically, for typical rotating drum arrangements, the period when more than 1 to 2 s produces flat top halftone dots, and when significantly less than 1 s, e.g., 0.5 s or less, produces round top halftone dots. The transition from flat top to round tops comes gradually with change of the period in the order of magnitude of 1 s. The overall UV dose is maintained the same no matter what the period of repetition, so that complete curing is achieved.

One embodiment includes a method of curing a printing plate made of or having photo-curable material thereon. The method includes producing light energy, e.g., UV light energy on part of the printing plate using a light exposure unit, and further producing relative motion between the light source and the printing plate in at least a transverse direction such that the light intensity is applied repeatedly to any region of the plate by moving the light source periodically in the transverse direction, with a period denoted T. At any time, the light source illuminates a relatively small proportion of the extent of the printing plate in the transverse direction. The period T is controlled to produce either flat top halftone dotes or round top halftone dots. More specifically, for typical rotating drum arrangements, the period when more than 1 s to 2 s produces flat top halftone dots, and when significantly less than 1 s, e.g., 0.5 s or less, produces round top halftone dots. The overall UV dose is maintained the same no matter what the period of repetition, so that complete curing is achieved.

One embodiment includes a photo-curable printing plate, cured according to a method of curing a printing plate made of or having photo-curable material thereon. The method includes producing light energy, e.g., UV light energy on part of the printing plate using a light exposure unit, and further producing relative motion between the light source and the printing plate in at least a transverse direction such that the light intensity is applied repeatedly to any region of the plate by moving the light source periodically in the transverse direction, with a period denoted T. At any time, the light source illuminates a relatively small proportion of the extent of the printing plate in the transverse direction. The period T is controlled to produce either flat top halftone dotes or round top halftone dots. More specifically, the period when significantly less than 10 s, e.g., 0.5 s or less, produces plat top halftone dots, and when more than 20 s produces round top halftone dots. The overall UV dose is maintained the same no matter what the period of repetition, so that complete curing is achieved.

Particular embodiments may provide all, some, or none of these aspects, features, or advantages. Particular embodiments may provide one or more other aspects, features, or advantages, one or more of which may be readily apparent to a person skilled in the art from the figures, descriptions, and claims herein.

Curing Polymer Plates:

The term photopolymer plate, or in its shortened form, polymer plate is used herein to refer to any printing plate, cylinder or sleeve that is cured by application of light, such as ultraviolet (UV) radiation, i.e., that is made of or has thereon a photo-curable material such as a photopolymer. While today, the UV curable material is typically made of a polymer, hence the term, in this disclosure including the claims, a photopolymer plate, or a polymer plate for short, means a plate, cylinder or sleeve made of or with any UV curable material thereon.

UV curing will briefly be described by way of background. The present invention, however, does not depend on any particular theory.

It is believed that the absence or presence of oxygen during the curing process plays an important role in the shape of the three-dimensional structure in the plate. It is believed that oxygen acts as an inhibitor to the polymerization: oxygen molecules end the chain reaction of polymerization and restrict the length of polymer chains formed by the polymerization. The oxygen inside the plate material is used up by this process.

A certain amount of oxygen already exists inside the plate materials when the UV curing starts. Additional oxygen from the surrounding air can enter the plate during the curing process once the oxygen concentration inside the plate drops.

FIG. 1 shows a simple cross-section of an example halftone dot that results from UV exposure through a mask by UV light from a UV source. The solid line shows the halftone dot profile when there is no or relatively little oxygen during curing, while the broken line shows a simple example of the sort of dot profile that results when there is a lot of oxygen during curing, i.e., during the polymerization process. The presence of oxygen is believed to cause shorter polymer chains than with less oxygen, resulting in a kind of melting of the halftone dots as shown in the broken line profile in FIG. 1.

Figure 2:
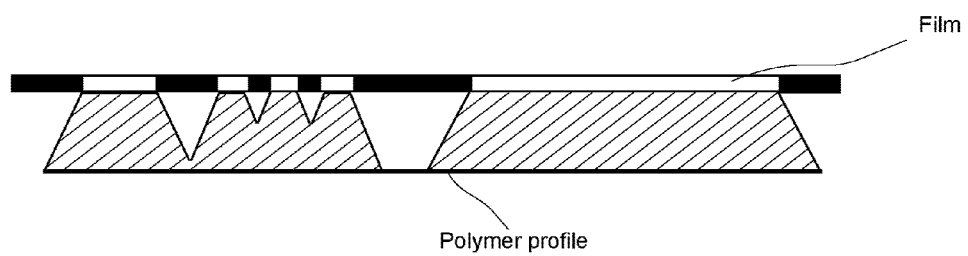
FIG. 2 which shows a simple cross-section of an example printing pattern with flat tops that results from UV exposure through a film mask by UV light from a UV source; the shape is called a flat top shape herein.

In an analog plate process, e.g., in which a film with the image thereon is placed on top of the polymer plate, and the polymer plate is cured by UV light, the UV light enters via the film. The film is believed to act as a barrier for the oxygen from the environment. This makes the polymer grow until the top of the surface like shown by the solid line in FIG. 1, and also as in FIG. 2 which shows a simple cross-section of a simple example printing pattern with flat tops that results from UV exposure through a film mask by UV light from a UV source. Such a shape is called a flat top shape herein. One property of flat top halftone dots is that they are capable of producing printed dots that each have sharp dot edges.

Figure 3:
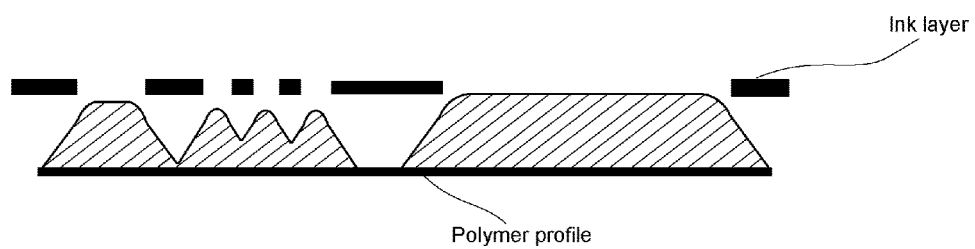
FIG. 3 shows a simple cross-section of an example printing pattern with round tops that results from UV exposure through a laser ablated film by UV light from a UV source; such a rounded shape is called a round top shape herein.

In a digital printing process, e.g., in which an ablatable layer is ablated with a laser beam, the plate material underneath is cured by UV light entering the plate through the revealed areas. Oxygen can also readily enter the plate through these ablated areas and through the ablateable material as well. It is observed that the halftone dots do not grow flat, and may not reach up to the original surface level of the polymer plate, but instead build round shaped structures which stay at slightly below the original surface level, as shown, for example by the dotted line of FIG. 1. FIG. 3 shows a simple cross-section of a simple example printing pattern with round tops that results from UV exposure through a laser ablated film by UV light from a UV source. Such a rounded shape is called a round top shape herein.

Round tops are sometimes desirable because they can be used to form very small halftone dots.

Digital processes offer the advantage that no film or film processing equipment or the related chemicals are necessary. Digital processes are also believed to be more precise and capable of smaller dot sizes and higher line count resolutions.

It is sometimes desired to obtain flat tops with a digital process. One known method includes placing a film over the ablated material during curing to simulate a conventional analog process. However, such a process is cumbersome, and furthermore, choosing between a flat top and a round top result requires more equipment and more workflow methods.

Described herein is an apparatus and a method of curing plates made of or having photo-curable material thereon that enables an operator to choose having features with flat tops or with round tops, and using the same digital workflow equipment for both cases. Features of embodiments of the invention include the easy incorporation into a workflow for inline exposure according to an imaging pattern and curing.

Some Embodiments

Embodiments of the invention include a method of curing plates and an apparatus for curing printing plates. The plates are made of or have thereon photo-curable material, e.g., UV curable material such as photopolymer. The methods and apparatuses allow the shape of three dimensional printing features, such as halftone dots and other structures on the printing plate to be controlled.

Embodiments of the method and the apparatus are applicable to digital flexography, digital letterpress printing, and/or to making other digital printing plates, as well as for curing polymer sleeves and polymer coated printing cylinders.

The apparatus includes a light exposure unit including a light source, e.g., a UV source, and a drive mechanism to produce relative motion between the light exposure unit and the plate during curing of the plate, and a control system configured to control the drive mechanism and the light exposure unit.

The inventors have discovered that the relative speed between the light exposure unit and the plate during curing can affect whether the curing results in round tops or flat tops. In particular, while normally, round tops are produced an an inline curing workflow for digital plates, the inventor has discovered that by having a relatively low relative speed, a much higher irradiance level is produced at the tops of the plate.

Thus, in embodiments of the present invention, the control system is configured to control the relative speed of the relative motion between the light exposure unit and the plate during curing.

Figure 5:
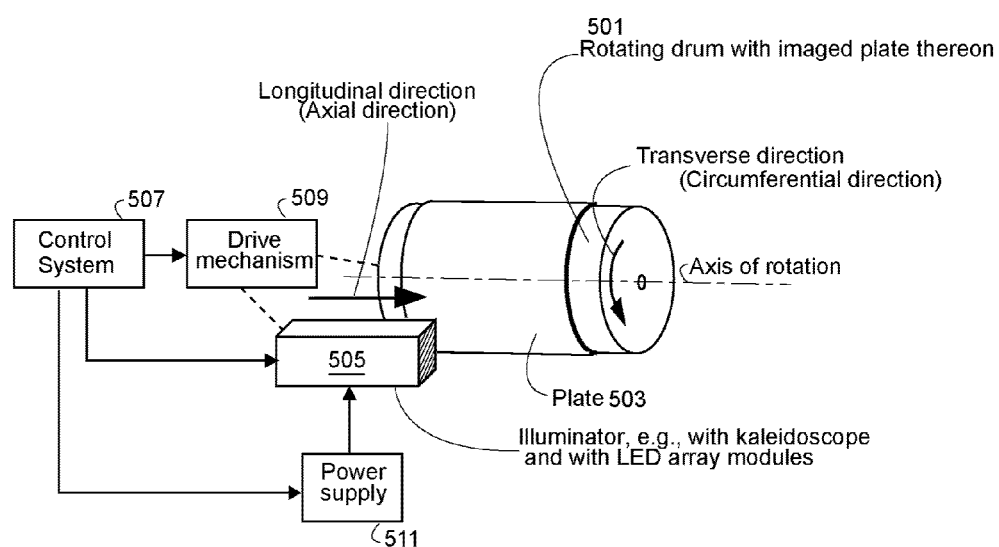
FIG. 5 shows a simplified block diagram of one embodiment of a curing apparatus that includes a rotating drum with a polymer plate thereon.

FIG. 5 shows a simplified block diagram of one embodiment of the invention that includes a rotating drum 501 with a polymer plate 503 thereon, the plate 503 being an imaged plate, that is, having with the image mask thereon. An exposure unit with light source 505, e.g., a UV source moves parallel to the drum axis in what is called the longitudinal direction. A control system 507 is connected to a drive mechanism 509, a power supply 511 and the exposure unit 505.

The apparatus is arranged such that the drive mechanism produce relative motion between the light source 505 and the plate 503 during curing of the plate by at least rotation of the drum, and a control system coupled to and configured to control the drive mechanism and light exposure unit. At any time during operation, the light source 505 illuminates a relatively small proportion of the extent of the printing plate in the transverse direction of rotation of the drum. The light intensity from the light source is applied repeatedly and periodically to any region according to the rotational speed of the drum. Denote the period by T and the rotational speed by w radians per sec, i.e., 60 ω/2π RPM. The period T is 2π/ω. Denote the time spent on any point on the plate by during a sweep of period T by ΔT, so that at any point in time during each sweep, ΔT/T of the plate's extent in the transverse direction is illuminated.

The inventors have noted that when T is relatively small, e.g., significantly less than about half a second for many common photopolymer materials and a common geometry wherein, for example, ΔT/T is ⅒ or less, then round tops are produced, while when T is more than about 1 to 2 s for the same photopolymer materials, then flat tops can be produced, in all cases maintaining the overall UV dose constant. These speeds were found to depend on the plate material, the intensity of the light source, and on the proportion of the plate that is illuminated at any one time.

As an example, for the rotational speed less than 60 RPM, e.g., around 30 RPM or less, flat tops can be produced, and for rotational speed more than 120 RPM, round tops can be produced.

Denote by $I_R$ effective intensity for producing round tops. This is the intensity that the plate would be cured at in a traditional bank UV curing system. $I_R$ is around 20 mW/cm$^2$ for common photopolymer materials. Denote by $I_F$ the effective intensity for producing flat tops. When $I_R$ is around 20 mW/cm$^2$ for common photopolymer materials, the inventor has found that $I_F$ is around 40 mW/cm$^2$. While higher values of $I_F$ may be used, too high a value may produce concave halftone dots rather than flat tops.

The UV dose (the fluence) is the energy per unit area. For common photopolymer plates such as Cyrel (™) photopolymer plates made by E. I. du Pont de Nemours and Company of Winlington, Del., USA, the dose for curing is between 7 to 15 Joule/cm$^2$. For thick plates, the required fluence may be around 20 Joule/cm$^2$.

The intensity generated by the light source's output aperture varies from 100 mW/cm$^2$ to as high as 400 mW/cm$^2$ depending on the type of source.

One possible theory of operation for why the invention works is that if the relative speed of relative motion of the light source to the to-be-cured plate is fast enough, the received UV energy is integrated over the exposure time. That is, the UV light is distributed over the entire plate surface.

Suppose the irradiation of any region occurs by repeated radiation by the light source over a certain duty cycle. Suppose the UV radiation is repeated each period of time denoted by T, and occurs for an active time ΔT. T of course is inversely proportional to the speed or relative motion between the light source and the plate.

The inventors have found that the effective intensity presented to the polymer material depends on the relationship between a time constant, denoted τ of the order of 1 second for most materials. This is thought to be the time constant for the mobility of oxygen in the polymer material. If the irradiation of any give area of time occurs with a sufficiently high repetition rate with a relatively low duty cycle, that is, if for any part of the photopolymer, after each active time interval and before the repeated active time interval, there will be insufficient time for oxygen to stop polymer chains, then the exposure to light is integrated over the overall exposure time.

The inventors have found that there is an effective UV intensity. Denote by $I_0$ the intensity from the light source in units of power per unit area. The effective intensity, denoted $I_{eff}$ is:

$$I_{eff}=I_0[1-(1-\Delta T/T)\exp(-T/\tau)].$$

Note that if T≥τ, e.g., if T>>τ, e.g., if T>2τ, then $I_{eff} \approx I_0$, while if T<<τ, e.g., if T<0.2τ, $I_{eff} \approx (\Delta T/T)I_0 < I_0$.

The inventors have observed that T is in the order of 10 s to 20 s for common photopolymer materials such as, for example, Cyrel DPI (™) from E.I. Dupont de Nemours and Company, Wilmington, Del. (DuPont), or the Nyloflex (™) ACE printing plate from Flint Group of Luxembourg.

To produce round tops, suppose T<<τ, e.g., T<0.2τ, so that $I_{eff} \approx [1-(\Delta T/T)]I_0$. Suppose further that $I_{eff}=I_R=20$ mW/cm² for producing round tops.

For example, for a geometry in which 10% of the extent of a plate is illuminated at any one time, $I_0=20/(\Delta T/T)=200$ mW/cm².

As an example, using this value for $I_0$ to determine the period of repetition to achieve 40 mW/cm², considered to be suitable to achieve for flat tops, T/τ=1 n (9/8)≈0.12. For τ approximately equal to 16 s, T≈2 s, so that in the case of a rotating drum arrangement, the drum would rotate at approximately 30 RPM or less.

Hence, in rotating drum embodiments of the invention, if the speed of rotation is such the that period of rotation is less than 1 s, i.e., if the drum rotates at less than about 60 RPM, e.g., at 30 RPM or lower, then halftone dots having flat tops are produced. If on the other hand, the speed of rotation is more than 60 RMP, e.g., over 120 RPM, then round tops are produced.

See FIG. 10 and the explanation thereof under the section titled "Possible theory of operation" herein below.

Thus, one embodiment has been described in which the drive mechanism causes the light source to move along the direction of the axis or rotation of a rotatable drum having a plate thereon while the drum is rotated by the drive mechanism in order to cure the curable material of or on the plate. The drive mechanism together with the control system is such that the speed of rotation can be controlled so as to result in either flat top halftone dots for relatively slow speed of rotation below 60 RPM, e.g., 10 to 30 RPM and round tops for speeds of rotation above 60 RPM, e.g., 400 RPM for round tops.

Some embodiments use LED arrays, e.g., UV LED arrays for the light source 505. Such arrays are made, for example, by Nichia Corporation of Tokyo Japan. Such LED arrays feature having a relatively small amount of waste energy. Thus, in one embodiment, the light source of exposure unit 505 includes a plurality of LEDs. The LEDs are arranged so that the output intensity at the output aperture of the light source, denoted $I_0$ is between 100 mW/cm² to as high as 400 mW/cm², depending on the number of LED arrays in the source, and the current applied to the LEDs. In one embodiment, an adjustable power supply to supply power to the LEDs is included, and such power supply can produce various currents to drive the LEDs under control of the control system.

In one embodiment, the light exposure unit includes a light tunnel of light-reflective, e.g., mirrored walls and has a polygonal cross-section like a kaleidoscope. Each wall has a reflective inner surface. The light source is located at or near one end, called the source end of the light tunnel and arranges to produce light radiation to the inside of the light tunnel towards the other end of the light tunnel, called plate end, including towards the reflective inner surfaces of the walls.

One such light exposure unit is briefly described in above-mentioned U.S. Patent Application US 2009-0294696 A1, the contents of which are incorporated herein by reference. Other such light exposure units are described in more detail in commonly owned U.S. Patent Application publication US 2009-0290891 A1, to inventor Sievers, the contents of which are incorporated herein by reference.

Figure 9A:
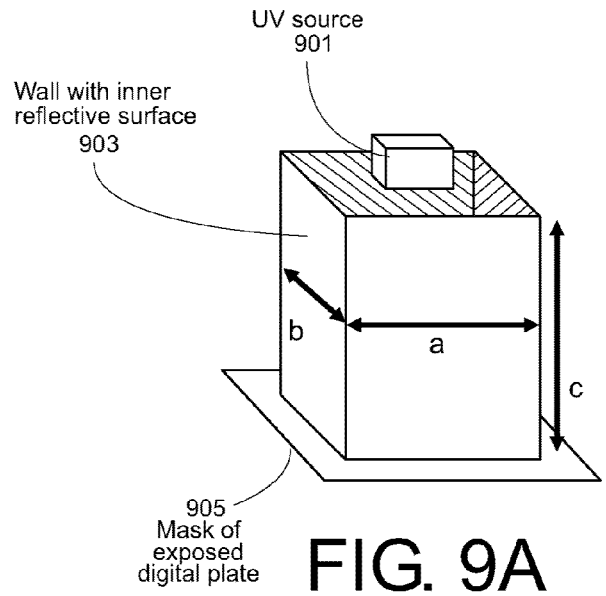
FIG. 9A shows a simplified drawing of one example of a light tunnel light exposure unit that can be used in embodiments of the present invention.

FIG. 9A shows a simplified drawing of one example of a light tunnel light exposure unit. The light tunnel includes four side walls 903 each having a reflective inner surface, e.g., by each wall being mirrored or having a mirror attached on the inner surface, so that the light tunnel has a rectangular cross-section. Other embodiments have cross sections that are other than rectangular. In FIG. 9A, the dimensions for a rectangular cross-section are shown as the width of the long side, denoted a, the width of the wide side, denoted b, and the light tube length, also called its height, denoted c. A UV source 901 located at or near one end, called the source end of the light tunnel and arranges in operation to produce light radiation, e.g., UV radiation to the inside of the light tunnel towards the other end of the light tunnel, called the plate end, including towards the reflective inner surfaces of the walls. The plate end is placed near an exposed mask 905 that is on the surface of photocurable plate material, e.g. a polymer plate. Typically, the mask 905 is an exposed part of a digital plate. The dimensions a, b, and c are configured according to parameters such as the plate size in the case of illuminating a whole plate, the power output(s) of the light source, that is, the power output of the light tube and how much of the power is directed towards the inside of the tube.

Figure 9B:
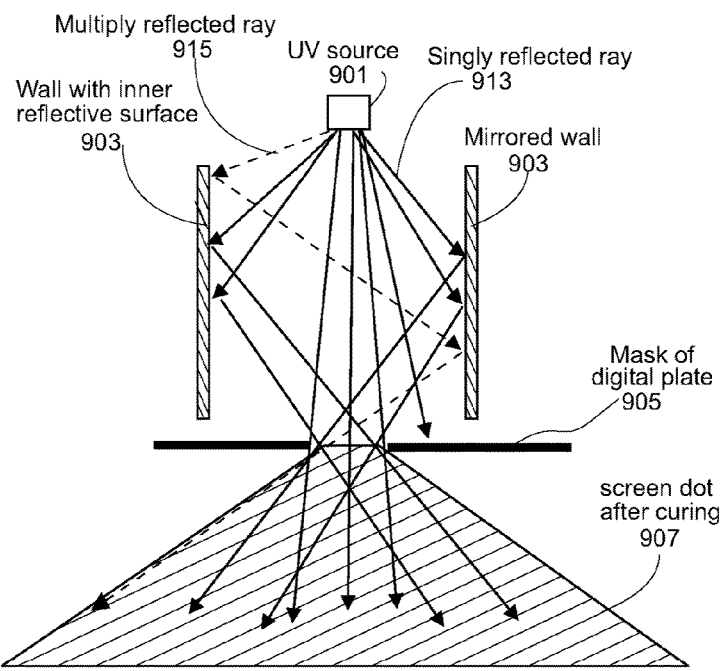
FIG. 9B shows a simplified cross-section of light tunnel and light source, e.g., UV source and also the cross-section of an example halftone dot exposed by a light exposure unit that includes a light tube and a light source, including pair of opposite mirrors of a "kaleidoscope" light tube made of pairs of opposite walls with reflective inner surfaces, e.g., mirrors in accordance with an embodiment of the present invention.

FIG. 9B shows a simplified cross-section of light tunnel and light source, e.g., UV source and also the cross-section of an example halftone dot 907 exposed by a light exposure unit that includes a light tube and a light source, including pair of opposite mirrors of a "kaleidoscope" light tube made of pairs of opposite walls 903 with reflective inner surfaces, e.g., mirrors in accordance with an embodiment of the present invention. The support shoulders of the halftone dot 907 that result by exposure by such a "kaleidoscope" source is broader than if the same UV source 901 was used without the kaleidoscope light tunnel. FIG. 9B shows singly reflected ray such as ray 913 and a multiply reflected ray of light 915, e.g., of UV. Having such multiple wall reflections in a kaleidoscope broadens the shoulders that support small features such as a halftone dot. The ray 915 that is so-reflected multiple times is shown by a dotted line.

Figure 9C:
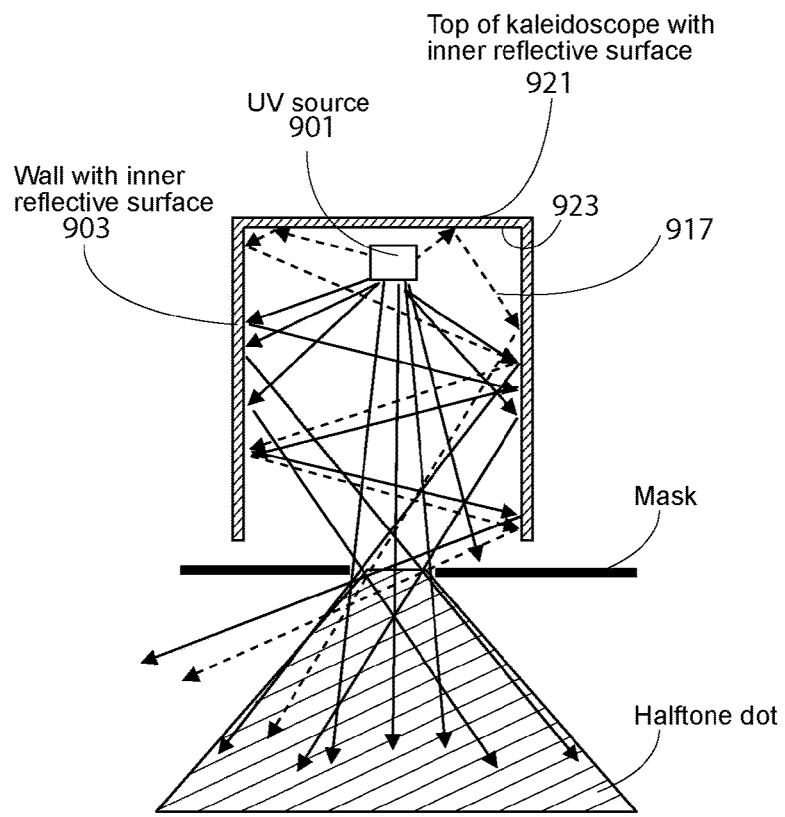
FIG. 9C shows a simplified cross-section of a halftone dot exposed by a source using a light tube that includes, in addition to the side walls with respective inner reflective surfaces, an additional another element with an inner reflective surface located behind the light source and parallel to the photocurable plate.

FIG. 9C shows a simplified cross-section of an example cured halftone dot exposed by a light source 901, using a light tube that includes, in addition to the side walls 903 with respective inner reflective surfaces, an additional another element 921 with an inner reflective surface 923, e.g., a flat mirror located behind the light source, e.g., UV source and parallel to the polymer plate. In FIG. 9C, rays that are reflected off the flat mirror behind the light source, e.g., rays 917 are shown as broken lines.

In different embodiments of the kaleidoscope illuminator such as FIGS. 9A, 9B or FIG. 9C, the reflective surface can be made of different materials. In general, the reflectors of embodiment can be built of flat mirrors or of materials with reflective surfaces, so these walls having reflective inner surfaces can be inexpensive and easy to build.

In one embodiment in which LEDs are used, the current through the LEDs is adjusted such that $I_{eff}$ when the drum rotates at more than about 60 RPM, e.g., at 400 RPM, is about 20 mW/cm$^2$, and such that the $I_{eff}$ for flat tops is 40 mW/cm$^2$.

While one embodiment includes a light exposure unit that includes LED arrays, alternate embodiments may use different ways of achieving output illumination intensity.

In one alternate embodiment, the light source includes a plurality of arc lamps. In another embodiment, the light source includes fluorescent light tubes.

In another one embodiment, the plate is on a flatbed, e.g., of a flatbed scanner, also called an x-y table, and a drive mechanism is configured to produce relative motion between the exposure unit and the plate.

Figure 6:
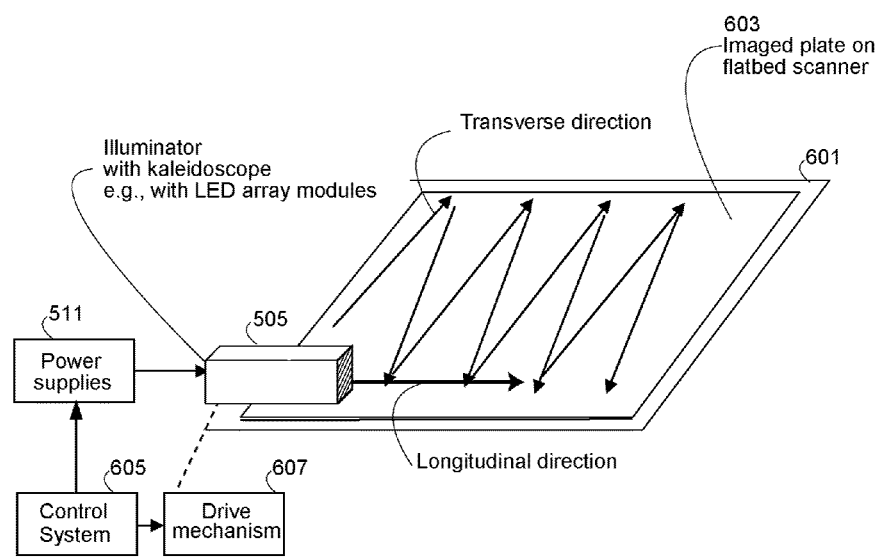
FIG. 6 shows in simplified form one example embodiment of a flatbed illuminating arrangement.

In one such embodiment, the light source moves during curing above the plate placed on a flatbed table. FIG. 6 shows a simplified block diagram of one embodiment of such a flatbed 601 in which a plate 603 with a mask thereon is cured. A control system 605 is coupled to a power supply 611 and configured to control the output of an illumination unit 605. The control system 605 also is coupled to and configured to control a drive mechanism 607 that is configured to move the illumination unit 605 back and forth in a transverse direction while also moving the illumination unit 605 in a longitudinal direction. The drive mechanism together with the control system is such that the speed of back and forth motion and repetition rate can be controlled so as to result in either flat top halftone dots for relatively slow repetition rate with a period of repetition more than about 1 second, e.g., around 2 to 4 seconds, and round tops for relatively fast repetition rate with a period of repetition less than about 1 second, e.g., 0.5 s or less, or better, around 0.2 s second or less for round tops.

Figure 7:
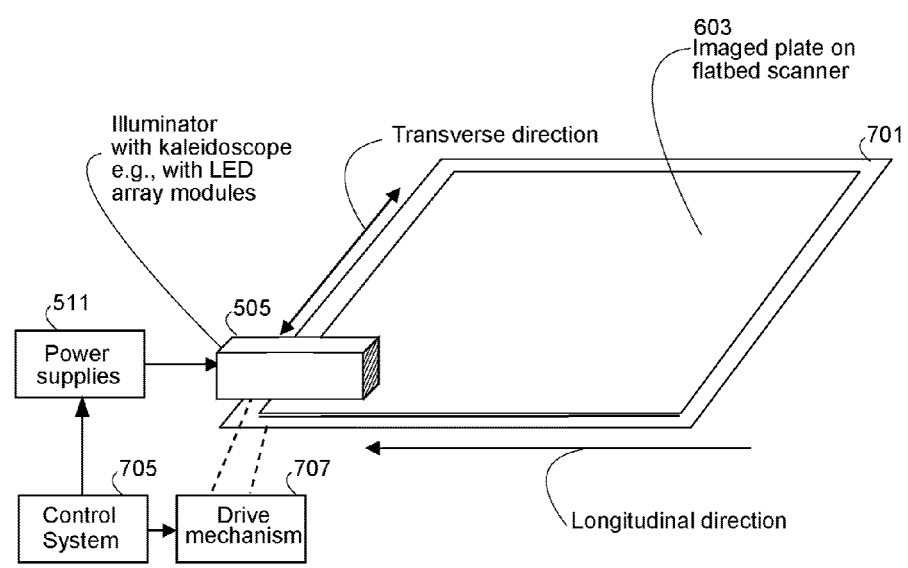
FIG. 7 shows in simplified form another example embodiment of a flatbed illuminating arrangement.

In another embodiment, the light source moves during curing in a transverse direction and the polymer plate moves during curing in a longitudinal direction perpendicular to the transverse axis. FIG. 7 shows a simplified block diagram of one embodiment of such a flatbed 701 in which a plate 603 with a mask thereon is cured. A control system 705 is coupled to a power supply 611 and configured to control the output of an illumination unit 605. The control system 705 also is coupled to and configured to control a drive mechanism 707 that is configured to move the illumination unit 605 back and forth in a transverse direction while also moving the plate in a longitudinal direction. The back and forth motion is controllable to achieve either flat-tops or round tops so as to result in either flat top halftone dots for relatively slow repetition rate with a period of repetition with a period of repetition more than about 1 second, e.g., around 2 to 4 seconds, and round tops for relatively fast repetition rate with a period of repetition less than about 1 second, e.g., 0.5 s or less, or better, around 0.2 s or less for round tops.

While in one embodiment, the relative motion in the transverse direction is produced by relative motion between the light source and the plate, in some embodiments, e.g., flat bed embodiments, the relative motion is produces by a stationary light source and a rotating polygon mirror as is known in the art.

One advantage of the embodiments shown is that inline curing combined with imaging is possible. That is, the imaging and curing may be combined in the one apparatus. In some versions of the apparatuses shown in FIGS. 5, 6 and 7, a laser imaging unit including imaging elements is included and configured to transfer imaging data to the part of the plate precedes the curing illuminating part. In such a case, the plate is at some stage partially imaged.

In another embodiment, the imaging occurs separately prior to the plate being loaded for exposure to UV for curing. In such a case, the plate is fully imaged.

Figure 8:
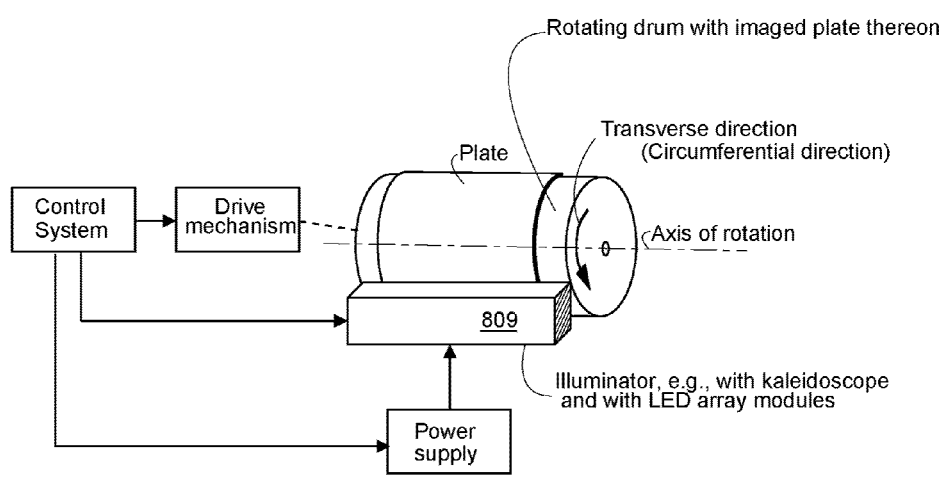
FIG. 8 shows an embodiment of a rotating drum arrangement in which the illumination unit extends to cover one dimension of the plate.

FIG. 8 shows a simple drawing of yet another embodiment of a rotating drum arrangement. In this arrangement, an illumination unit 809 is configured to illuminate the plate. In this embodiment, the illumination unit 809 extends to cover one dimension of the plate. In the example shown, this is the longitudinal direction. Relative motion in only one direction is then necessary, in this example, the circumferential, i.e., transverse direction. The control system is coupled to the drive mechanism and arranged to control the speed of rotation. The drive mechanism together with the control system is such that the speed of rotation can be controlled so as to result in either flat top halftone dots for relatively slow speed of rotation below 60 RPM, e.g., 10 RPM and round tops for speeds of rotation above 60 RPM, e.g., 400 RPM for round tops.

One advantage of the embodiment shown in FIG. 8 is that with it, inline curing is possible.

In FIGS. 5 to 8, some elements such as the illuminating source have different reference numbers but may be similar or identical in structure. Similarly the plate and other shown elements may be similar or identical even if different reference numerals are used.

Note that some of the arrangements above may include an imaging unit to enable inline imaging and curing. Other arrangements do not include the imaging unit. The invention is not limited to combining of the imaging and curing in one exposure apparatus, and in some arrangements, the imaging and curing can be carried out separately each in its own apparatus. Therefore, in some arrangements, there is a separate imaging apparatus, e.g., a rotating drum imaging apparatus as is known in the art, or a flatbed imaging apparatus as is known in the art, and also a separate curing apparatus, e.g., a flatbed arrangement that include one or more features of the present invention or a rotating drum arrangement that include one or more features of the present invention.

Other variations also are possible.

Note that in some embodiments, the control system is configured such that the two periods of repetition, that is the first period of repetition and the higher second repetition period are preset for different plate types.

Possible Theory of Operation

In order to enhance understanding of features of the present invention, a theory of operation is presented. Any such theory or mechanism of operation or finding presented herein is not intended to make the present invention in any way dependent upon such theory, mechanism of operation or finding.

The inventor has noticed several properties of curing at different intensity levels, i.e., different levels of power per unit area. Using a very simplified view of polymerization process, polymerization can be broken up into three reaction steps:

1) Activation of the starter radicals by UV light.
2) Chain growth of the polymer.
3) Chain ending through oxygen.

Each reaction has a certain time constant and total time. For common polymer plates such as Cyrel DPI (™) from E.I.

Dupont de Nemours and Company, Wilmington, Del. (DuPont), the time for the entire curing process is between 12 and 15 minutes at an illumination intensity (power per unit area) of 19-20 mW/cm$^2$.

This results in an energy per unit area of 14.4 to 18 Joules/cm$^2$ to get all radicals starting chains. The activating the radicals step occurs relatively fast when a starter radical interacts with a light photon. A long exposure time is required because the polymer material is not fully packed with starter radicals, and not every photon hits a starter radical. Thus it takes a certain amount of photons and consequently energy, to activate all starter radicals and in principle they could be activated all at the same time.

Polymers include a certain amount of oxygen. However, because conventional processes still enable flat tops, the amount of oxygen inside the plate in itself is not sufficient to get round tops. For round tops, it is believed additional oxygen has to diffuse into the plate.

Diffusion in dense matter is a slow process. If the intensity is increased, that is, there are more photons per unit area, more polymer chains can be started, while the number of chains finished by oxygen remains the same as with the lower intensity.

Figure 4A:
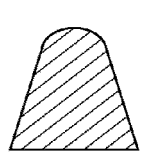
FIG. 4A shows simple cross-section representative of a round top halftone dot when the period of repeated irradiation of each region is higher than the medium time constant of the photopolymer.
Figure 4B:
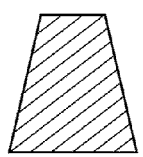
FIG. 4B shows simple cross-section representative of a flat top halftone dot, e.g., as obtained in a digital process at second intensity level when the period of repeated irradiation of each region is lower than the medium time constant of the photopolymer.
Figure 4C:
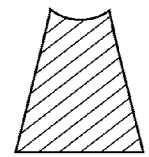
FIG. 4C shows simple cross-section of a concave top halftone dot, e.g., as obtained in a digital process at an intensity higher than the intensity level used to produce the example halftone dot of FIG. 4B.

The inventor has discovered that increasing the intensity can lead to more activation of the starter radicals. The inventor ran some experiments, and discovered that, staring with the specified curing for a plate, e.g., for certain common polymer types, e.g., DuPont's Cyrel DPI of exposure to around 19-20 mW/cm$^2$ for about 15 minutes, and then doubling the intensity from 20 mW/cm$^2$ to 40 mW/cm$^2$ gives a significant change from a convex round top to flat top. Indeed, if the power level is increased even further the top of the halftone dots will take a concave shape. FIG. 4A shows simple cross-section of a round top halftone dot, e.g., as obtained in a digital process at a first intensity level, e.g., 20 mW/cm$^2$. FIG. 4B shows simple cross-section of a flat top halftone dot, e.g., as obtained in a digital process at a second intensity level, e.g., 40 mW/cm$^2$. FIG. 4C shows simple cross-section of a concave top halftone dot, e.g., as obtained in a digital process at an intensity higher than the second intensity level.

In brief, one possible theory for why higher intensities can produce flat tops is that at higher UV intensities, more chains are started that are stopped by any oxygen present in a given exposure time.

One possible theory of operation for why the invention works, is that if the relative speed of relative motion of the light source to the to-be-cured plate is fast enough, the received UV energy is integrated over the exposure time. That is, the UV light is distributed over the entire plate surface.

Suppose the irradiation of any region occurs by repeated radiation by the light source over a certain duty cycle. Suppose the UV radiation is repeated each period of time denoted by T, and occurs for an active time $\Delta T$. T of course is inversely proportional to the speed o relative motion between the light source and the plate.

The inventors have found that the effective intensity presented to the polymer material depends on the relationship between a time constant, denoted $\tau$ of the order of 10 to 20 second for common photopolymer plates. This is thought to be the time constant for the mobility of oxygen in the polymer material. If the irradiation of any give area of time occurs with a sufficiently high repetition rate with a relatively low duty cycle, that is, if for any part of the photopolymer, after each active time interval and before the repeated active time interval, there will be insufficient time for oxygen to stop polymer chains, then the exposure to light is integrated over the overall exposure time.

The inventors have found that there is an effective UV intensity. Denote by $I_0$ the intensity from the light source in units of power per unit area. The effective intensity, denoted $I_{eff}$ is:

$$I_{eff}=I_0[1-(1-\Delta T/T)\exp(-T/\tau)].$$

Note that if $T \geq \tau$, e.g., if $T>>\tau$, then $I_{eff} \approx I_0$,
while if $T<<\tau$, $I_{eff} \approx (\Delta T/T)I_0<I_0$.

Figure 10:
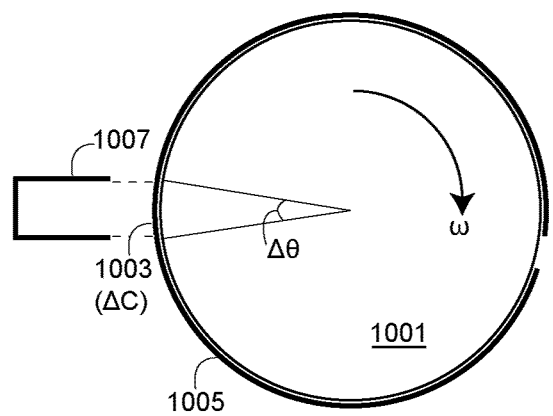
FIG. 10 shows a simplified cross sectional view of a rotating drum with a plate thereon showing the small segment illuminated at any one time by a source of illumination, e.g., of UV light.

FIG. 10 shows a simplified cross sectional view of a rotating drum 1001 with a plate 1005 of the surface of the drum showing the small segment 1003 illuminated at any one time by a source of illumination, e.g., of UV light. Suppose $\Delta\theta$ is the angle subtended by the area 1003 on the surface of plate 1005 that is illuminated at any one time by the light source 1007. Suppose also that the overall circumference of the drum is C, and that the arc of the surface in the transverse direction corresponding to $\Delta\theta$ is $\Delta C$. Suppose also that the speed of rotation is $\omega$ radians/s, i.e., $60\omega/2\pi$ RPM. $T=2\pi/\omega$ seconds.
Then $\Delta T/T=\Delta\theta/2\pi=.\Delta\theta/2\pi=\Delta C/C$
In such a case, $$I_{eff}=I_0[1-(1-\Delta C/C)]\exp(-2\pi/\omega\tau)$$

Recall that the inventors have observed that T is in the order of 10 s to 20 s for common photopolymer materials.

As clear from FIG. 10, in rotating drum embodiments of the invention, if the speed of rotation is such the that period of rotation is more than about 1 s to 2 s, i.e., if the drum rotates at less than about 60 RPM, then halftone dots having flat tops can be produced. If on the other hand, the speed of rotation is more than 60 RMP, e.g., 120 rpm or more, round tops are produced.

Experimental Results

The inventor has carried out some experiments with a drum exposure unit that uses a drum with a circumference of 122 cm and using an LED based light source that produces an aperture of 7.5 cm in the transverse direction, so that $\Delta C/C=\Delta T/T \approx 0.061$.

The currents through the LEDs was adjusted so that $I_{eff}$ is 20 mW/cm$^2$ for relatively high rotational speed. That is, $I_0 \approx 330$ mW/cm$^2$.

Figure 11:
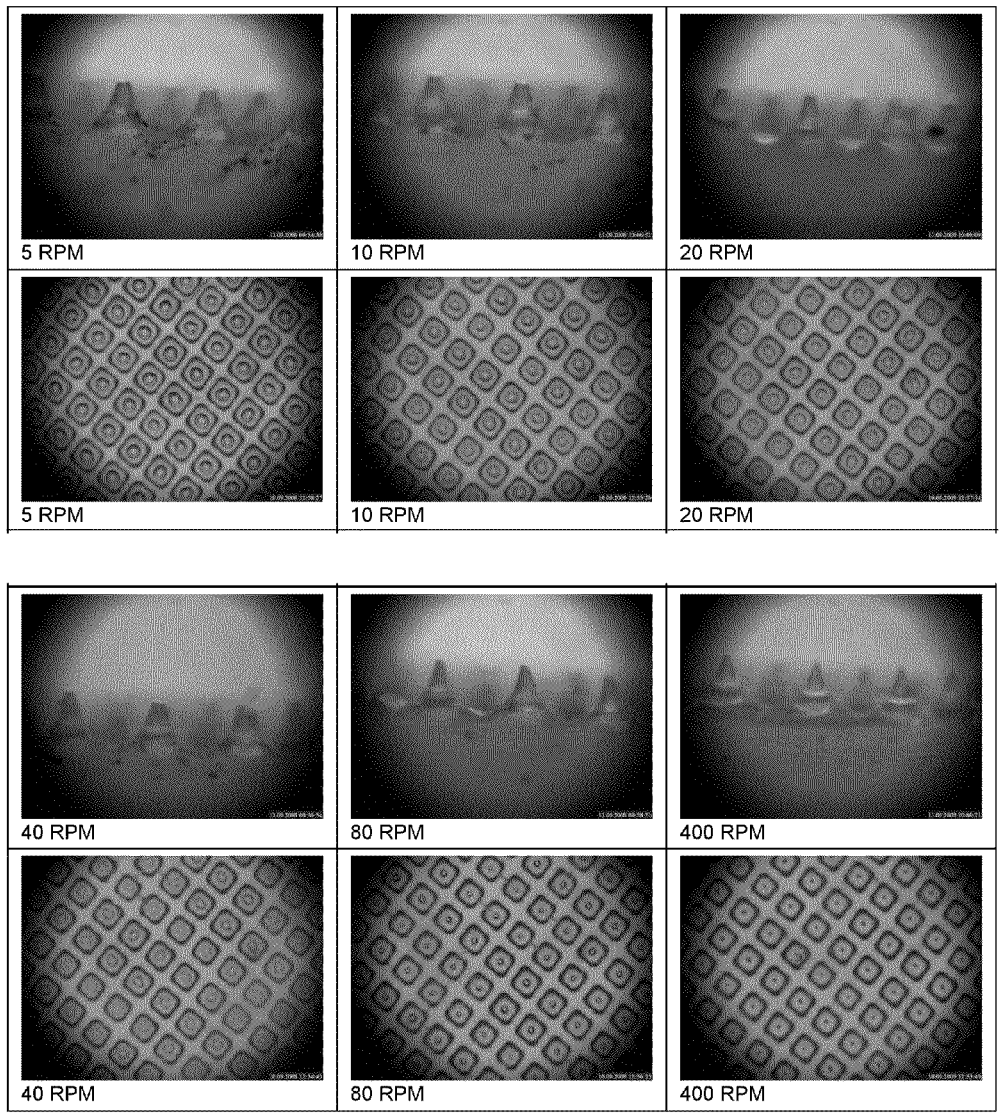
FIG. 11 shows top view photographs and angle photographs of halftone dots at various rotational speeds.

FIG. 11 shows top view photographs and angle photographs of halftone dots at various rotational speeds for a Cyrel DPI (™) 0.45 plate from DuPont. As can be see, the transition from round top to flat top starts at about 80 RPM. These photographs confirm that flat tops are indeed possible at low RPMs according to the geometry and type of plate.

The Plates

By the terms "polymer plate" and "photopolymer plate" herein is meant a plate with any type of photo-curable material thereon, whether made of polymer or not. One example is UV-curable material. Another example is material cured by light of different wavelength, not necessarily UV. While today, such curing is typically carried with UV, and such materials are typically photopolymers, use of the term "photopolymer" herein is not meant to be limiting to a polymer composition. The inventor anticipates that in the future, there may be new materials and compositions that also are curable UV radiation of a desired wavelength, and the invention is equally applicable to plates having such material thereon.

The method and apparatuses described herein are used for curing many types of plates. The plates can be flexographic plates, flexographic imaging cylinders, flexographic sleeves, and so forth. The plate also can be letterpress plates having UV curable material thereon. Furthermore, the plates can be imaged using a digital process, e.g., by laser ablating an abatable surface on the plate material prior to final curing, so that curing is with the mask on the plate material after ablation of some of the mask material according to imaging data.

Therefore, in some embodiments, the plate is a photopolymer printing plate that is a digital plate.

In some embodiments, a photopolymer printing plate that is a conventional analog plate.

In some embodiments, the plate is a photopolymer printing plate that is a sleeve.

In some embodiments, the plate is a photopolymer printing plate that is a polymer coated cylinder.

Furthermore, some embodiments of the invention are in the form of a plate—any of the plates described above—that has been cured, the curing according to a method as described herein.

Furthermore, some embodiments of the invention are in the form of a plate—any of the plates described above—that has been imaged then cured, the curing according to a method as described herein.

General

Unless specifically stated otherwise, as apparent from the following discussions, it is appreciated that throughout the specification discussions utilizing terms such as "processing," "computing," "calculating," "determining" or the like, refer to the action and/or processes of a computer or computing system, or similar electronic computing device, that manipulate and/or transform data represented as physical, such as electronic, quantities into other data similarly represented as physical quantities.

In a similar manner, the term "processor" may refer to any device or portion of a device that processes electronic data, e.g., from registers and/or memory to transform that electronic data into other electronic data that, e.g., may be stored in registers and/or memory. A "computer" or a "computing machine" or a "computing platform" may include one or more processors.

Note that when a method is described that includes several elements, e.g., several steps, no ordering of such elements, e.g., of steps is implied, unless specifically stated.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the above description of example embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the DESCRIPTION OF EXAMPLE EMBODIMENTS are hereby expressly incorporated into this DESCRIPTION OF EXAMPLE EMBODIMENTS, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

As used herein, unless otherwise specified the use of the ordinal adjectives "first", "second", "third", etc., to describe a common object, merely indicate that different instances of like objects are being referred to, and are not intended to imply that the objects so described must be in a given sequence, either temporally, spatially, in ranking, or in any other manner.

All U.S. patent publications, U.S. patents, and U.S. patent applications cited herein are hereby incorporated by reference. In the case the patent Rules or Statutes do not permit incorporation by reference of material that itself incorporates information by reference, the incorporation by reference of the material herein excludes any information incorporated by reference in such incorporated by reference material, unless such information is explicitly incorporated herein by reference.

Any discussion of prior art in this specification should in no way be considered an admission that such prior art is widely known, is publicly known, or forms part of the general knowledge in the field.

In the claims below and the description herein, any one of the terms comprising, comprised of or which comprises is an open term that means including at least the elements/features that follow, but not excluding others. Thus, the term comprising, when used in the claims, should not be interpreted as being limitative to the means or elements or steps listed thereafter. For example, the scope of the expression a device comprising A and B should not be limited to devices consisting only of elements A and B. Any one of the terms including or which includes or that includes as used herein is also an open term that also means including at least the elements/features that follow the term, but not excluding others. Thus, including is synonymous with and means comprising.

Similarly, it is to be noticed that the term coupled, when used in the claims, should not be interpreted as being limitative to direct connections only. The terms "coupled" and "connected," along with their derivatives, may be used. It should be understood that these terms are not intended as synonyms for each other. Thus, the scope of the expression a device A coupled to a device B should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Thus, while there has been described what are believed to be the preferred embodiments of the invention, those skilled in the art will recognize that other and further modifications may be made thereto without departing from the spirit of the invention, and it is intended to claim all such changes and modifications as fall within the scope of the invention. For example, any formulas given above are merely representative of procedures that may be used. Functionality may be added or deleted from the block diagrams and operations may be interchanged among functional blocks. Steps may be added or deleted to methods described within the scope of the present invention.

What is claimed is:

1. An apparatus for curing a printing plate made of or having photo-curable material thereon, the apparatus comprising:
    a light exposure unit including a light source to produce light energy on the printing plate at a wavelength or wavelengths suitable for curing the photo-curable material;
    a drive mechanism configured to produce relative motion between the illumination applied to the plate from the light exposure unit and the plate during curing of the plate, the relative motion including at least relative motion in a transverse direction; and
    a control system coupled to and configured to control at least the drive mechanism,
    wherein at any time, the light source illuminates a relatively small proportion of the extent of the printing plate in the transverse direction,
    wherein the control system is configured to repeat the relative motion between the illumination and the plate in the transverse direction, the repeating being periodic with a period of repetition, such that the illumination is applied periodically to any region of the plate with the period of repetition,
    wherein the control system is further configured such that the period of repetition is controllable between a first period of repetition and a second period of repetition, the second period of repetition being substantially longer than the first period of repetition,
    wherein the second period of repetition is selected such that curing at the second period of repetition produces printing features that have flat tops, and the first period of repetition is selected such that curing at the first period of repetition produces printing features that have round tops, the respective overall fluence at each of the first period of repetition and the second period of repetition being sufficient to cure the printing plate.

2. An apparatus as recited in claim 1,
    wherein the drive mechanism is configured to rotate a rotatable drum on which a photo-curable plate is placed such that the relative motion in the transverse direction is perpendicular to the axis of rotation of the drum, and
    wherein (i) the light exposure unit extends to cover the length of the drum; or (ii) the light exposure unit during curing moves relative to the printing plate in a longitudinal direction parallel to the axis of rotation of the rotating drum on which the plate is attached.

3. An apparatus as recited in claim 1, wherein the light from the light exposure unit moves back and forth in a transverse direction relative to the plate during curing above the plate placed on a flatbed table.

4. An apparatus as recited in claim 3, wherein the drive mechanism is configured to produce relative motion between the light exposure unit and the plate during curing of the plate, and/or
    wherein the drive mechanism includes a rotatable polygonal mirror configured when rotating to cause the periodic application of the illumination at the period of repetition during curing of the plate.

5. An apparatus as recited in claim 1, wherein the control system is configured such that the first period of repetition and the second period of repetition are preset for different plate types, different illumination intensities, and different drum sizes in the case of a rotating drum arrangement or different flatbed sizes in the case of a flatbed arrangement.

6. An apparatus as recited in claim 1, wherein the light exposure unit is arranged, for a particular rotating drum arrangement in the case of a rotating drum or a different flatbed size in the case of a flatbed arrangement, to provide for the second period of repetition an effective illumination the same as specified for curing the plate for flat tops in a stationary illumination device.

7. An apparatus as recited in claim 1, wherein the photo-curable plate is one of a photopolymer printing plate that is a flexographic plate, a photopolymer printing plate that is a flexographic sleeve, a photopolymer printing plate that is a polymer coated flexographic cylinder, or a photopolymer printing plate that is a letterpress plate.

8. An apparatus as recited in claim 1, wherein the photo-curable material is curable by ultraviolet light, and wherein the light source is a source of ultraviolet energy.

9. An apparatus as recited in claim 1, wherein the second period of repetition for producing flat top features is more than 2 seconds, and the first period of repetition for producing round top features is less than ½ second.

10. An apparatus as recited in claim 1, wherein the light source includes a plurality of LEDs and a power supply therefor.

11. An apparatus as recited in claim 1, wherein the light exposure unit includes:
    a light tunnel of light-reflective walls and having a polygonal cross-section like a kaleidoscope, each wall having a reflective inner surface; and
    the light source located at or near one end, called the source end of the light tunnel and arranged to produce light radiation to the inside of the light tunnel towards the other end of the light tunnel, called the plate end of the light tunnel, including towards the reflective inner surfaces of the walls.

12. An apparatus as recited in claim 1, wherein the light source includes a plurality of arc lamps.

13. A method of curing a printing plate made of or having photo-curable material thereon, the method comprising:
    illuminating the printing plate using light energy at a wavelength or wavelengths suitable for curing the photo-curable material using a light exposure unit,
    producing relative motion in at least one direction between the illumination applied to the plate from the light exposure unit and the plate during the illuminating of the plate, including repeating exposure of any part of the plate with a period of repetition, the relative motion including at least relative motion in a transverse direction,
    wherein at any time, the illuminating illuminates a relatively small proportion of the extent of the printing plate in the transverse direction,
    wherein the relative motion between the illumination of the plate and the plate in the transverse direction is repeated periodically with a period of repetition, such that the illumination is applied periodically to any region of the plate with the period of repetition,
    wherein the period of repetition is controllable between a first period of repetition and a second period of repetition, the second period of repetition being substantially longer than the first period of repetition, and
    wherein the second period of repetition is selected such that curing at the second period of repetition produces printing features that have flat tops, and the first period of repetition is selected such that curing at the first period of repetition produces printing features that have round tops, the respective overall fluence at each of the first period of repetition and the second period of repetition being sufficient to cure the printing plate.

14. A method as recited in claim 13, wherein the plate is on a rotating drum such that the relative motion in the transverse direction is perpendicular to the axis of rotation of the drum, and wherein (i) the light exposure unit extends to cover the length of the drum; or (ii) the light exposure unit during curing moves relative to the printing plate in a longitudinal direction parallel to the axis of rotation of the rotating drum on which the plate is attached.

15. A method as recited in claim 14, wherein the light from the light exposure unit moves back and forth in a transverse direction relative to the plate during curing above the plate placed on a flatbed table.

16. A method as recited in claim 14, wherein the photo-curable plate is one of a photopolymer printing plate that is a flexographic plate, a photopolymer printing plate that is a flexographic sleeve, a photopolymer printing plate that is a polymer coated flexographic cylinder, or a photopolymer printing plate that is a letterpress plate.

17. A method as recited in claim 14, wherein the photo-curable material is curable by ultraviolet light, and wherein the light exposure unit is a source of ultraviolet energy.

18. A method as recited in claim 14, wherein the second period of repetition for producing flat top features is more than 2 seconds, and the first period of repetition for producing round top features is less than ½ second.

19. A method as recited in claim 14, wherein the light exposure unit is arranged, for a particular rotating drum arrangement in the case of a rotating drum or a different flatbed size in the case of a flatbed arrangement, to provide for the second period of repetition an effective illumination the same as specified for curing the plate for flat tops in a stationary illumination device.

20. A method as recited in claim 14, wherein the light exposure unit includes a plurality of LEDs and a power supply therefor, or includes a plurality of arc lamps.

21. A method as recited in claim 14, wherein the light exposure unit includes:

a light tunnel of light-reflective walls and having a polygonal cross-section like a kaleidoscope, each wall having a reflective inner surface; and a light source located at or near one end, called the source end of the light tunnel and arranged to produce light radiation to the inside of the light tunnel towards the other end of the light tunnel, called the plate end of the light tunnel, including towards the reflective inner surfaces of the walls.

22. A printing plate made of or having photo-curable material thereon prepared and cured according to a preparation method that includes:

illuminating the printing plate using light energy at a wavelength or wavelengths suitable for curing the photo-curable material using a light exposure unit, producing relative motion in at least one direction between the illumination applied to the plate from the light exposure unit and the plate during the illuminating of the plate, including repeating exposure of any part of the plate with a period of repetition, where the period of repetition is a length of illumination of a part of the plate by the light source, the relative motion including at least relative motion in a transverse direction, wherein at any time, the illuminating illuminates a relatively small proportion of the extent of the printing plate in the transverse direction, wherein the relative motion between the illumination of the plate and the plate in the transverse direction is repeated periodically with a period of repetition, such that the illumination is applied periodically to any region of the plate with the period of repetition, wherein the period of repetition is controllable between a first period of repetition and a second period of repetition, the second period of repetition being substantially longer than the first period of repetition, and wherein the second period of repetition is selected such that curing at the second period of repetition produces printing features that have flat tops, and the first period of repetition is selected such that curing at the first period of repetition produces printing features that have round tops, the respective overall fluence at each of the first period of repetition and the second period of repetition being sufficient to cure the printing plate.

* * * * *